(12) United States Patent
Lin

(10) Patent No.: US 6,207,545 B1
(45) Date of Patent: Mar. 27, 2001

(54) METHOD FOR FORMING A T-SHAPED PLUG HAVING INCREASED CONTACT AREA

(75) Inventor: Chingfu Lin, Taipei (TW)

(73) Assignee: Taiwan Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 09/201,581

(22) Filed: Nov. 30, 1998

(51) Int. Cl.[7] ................................................ H01L 21/44
(52) U.S. Cl. .................... 438/597; 438/598; 438/599; 438/622
(58) Field of Search ..................... 438/584, 589, 438/592, 595, 605, 626, 631, 636–639, 643, 653, 675, 689, 691, 597, 622, 634, 624, 149, 151, 598, 599

(56) References Cited

U.S. PATENT DOCUMENTS

| | | | | |
|---|---|---|---|---|
| 5,939,788 | * | 8/1999 | McTeer | 257/751 |
| 5,960,320 | * | 9/1999 | Park | 438/688 |
| 5,980,657 | * | 11/1999 | Farrar et al. | 148/438 |
| 5,985,753 | * | 11/1999 | Yu et al. | 438/637 |
| 5,989,998 | * | 11/1999 | Sugahara et al. | 438/623 |
| 5,990,015 | * | 11/1999 | Lin et al. | 438/706 |
| 6,001,414 | * | 12/1999 | Huang et al. | 427/96 |
| 6,001,683 | * | 12/1999 | Lee | 438/241 |
| 6,001,735 | * | 12/1999 | Tsai | 438/638 |

OTHER PUBLICATIONS

C. Y. Chang S. M. Sze, VLSI Technology, 1996, The McGraw–Hill Companies, Inc., pp. 419–420 and 444–445.*

* cited by examiner

*Primary Examiner*—Matthew Smith
*Assistant Examiner*—V. Yevsikov
(74) *Attorney, Agent, or Firm*—Blakely, Sokoloff, Taylor & Zafman LLP

(57) ABSTRACT

A method for forming a T-shaped contact plug is disclosed. A first insulating layer is formed atop of a substrate. A second insulating layer is then formed atop of the first insulating layer. The first and second insulating layers are patterned and etched to form a contact opening to the substrate. A portion of the second insulating layer surrounding the contact opening is removed. Next, a barrier metal layer is formed along the walls of the contact opening and atop the second insulating layer. Then a conducting layer is formed into the contact opening and atop the barrier metal layer. Finally, a portion of the first conducting layer and barrier metal layer atop the second insulating layer is removed. This leaves a plug formed of the remaining portion of the conducting layer.

10 Claims, 3 Drawing Sheets

METHOD FOR FORMING A T-SHAPED PLUG HAVING INCREASED CONTACT AREA

FIELD OF THE INVENTION

The present invention relates generally to semiconductor manufacturing processes, and more particularly, to a method for forming a contact plug or via having increased contact area.

BACKGROUND OF THE INVENTION

In semiconductor manufacturing, plugs are used to connect conducting layers, such as metals and doped layers. FIGS. 1–3 show cross-sectional views of a semiconductor substrate 100, illustrating the steps of a conventional method for forming a plug. Turning to FIG. 1, an insulating layer 102 is deposited atop the substrate 100. Next, a contact opening 104 is formed by etching through the insulating layer 102. Then, a barrier metal layer 106 is deposited into the contact opening 104 and atop the insulating layer 102. A first conducting layer 108 is deposited into the contact opening 104 and atop the barrier metal layer 106.

Turning to FIG. 2, the portion of the first conducting layer 108 atop the insulating layer 102 and the portion of the barrier metal layer 106 atop the insulating layer 102 are removed by chemical mechanical polishing (CMP). The portion of the first conducting layer 108 inside the contact opening 104 remains to form a plug 110.

Turning to FIG. 3, a second conducting layer is deposited atop the plug 110 and the first insulating layer 102. Using conventional photolithography and etching techniques, portions of the second conducting layer are removed, leaving a conductive structure 112 above the plug 110. The etching is controlled to stop at the first insulating layer 102. As shown in FIG. 3, the plug 110 and the conductive structure 112 may not be in full contact. This undesirable result may occur because of misalignment between the conductive structure 112 and the plug 110 or because of differing dimensions between the conductive structure 112 and the plug 110.

What is needed is an improved method for forming a plug having an increased contact area.

SUMMARY OF THE INVENTION

A method for forming a T-shaped plug on a semiconductor substrate is disclosed. The method comprises the steps of: forming a first insulating layer atop said substrate; forming a second insulating layer atop said first insulating layer; patterning and etching said first insulating layer and said second insulating layer, stopping at said substrate, to form a contact opening; removing a portion of said second insulating layer surrounding said contact opening; forming a barrier metal layer along the walls of said contact opening and atop said second insulating layer; forming a first conducting layer into said contact opening and atop said barrier metal layer; and removing a portion of said first conducting layer and said barrier metal layer atop said second insulating layer, leaving a plug formed of the remaining portion of said first conducting layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
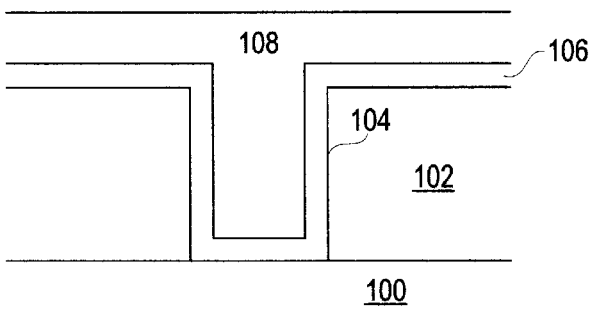
FIGS. 1–3 show cross-sectional views of a semiconductor substrate, illustrating the steps of a conventional method for forming a plug.
Figure 2:
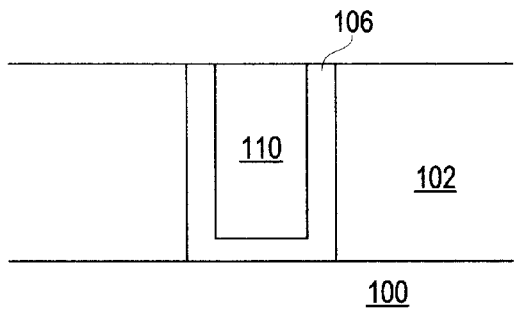
Figure 3:
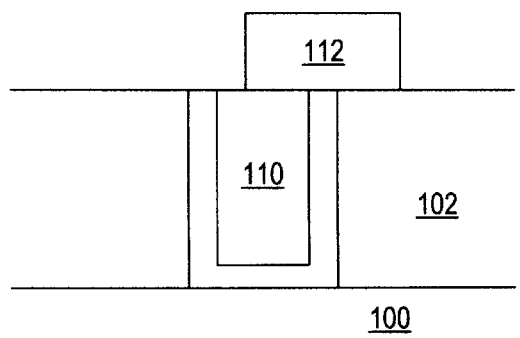
Figure 4:
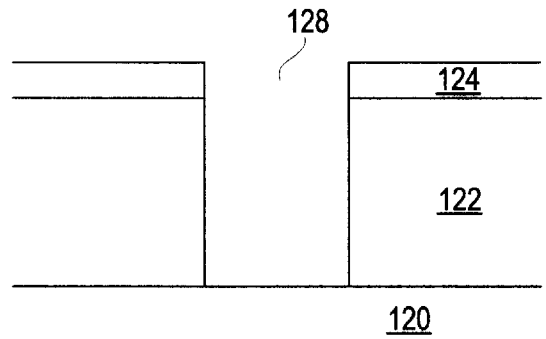
FIGS. 4–7 show cross-sectional views of a semiconductor substrate, illustrating the steps of the present invention.

Turning to FIG. 4, a semiconductor substrate 120 is shown. The substrate is understood to possibly include a semiconductive wafer, active and passive devices formed within the wafer, and layers formed on the wafer's surface. The term "substrate" is meant to include devices formed within a semiconductor wafer and the layers overlying the wafer.

In FIG. 4, a first insulating layer 122 is formed atop the substrate 120. The first insulating layer may be formed of silicon oxide, borophosphosilicate glass (BPSG), tetraethylorthosilicate (TEOS) oxide, fluorine doped oxide, or any combination thereof. A second insulating layer 124 is formed atop the first insulating layer 122. The second insulating layer is preferably formed of SiN, SiON, spin on glass (SOG), SiC, or other low k materials, and is preferably 100–2000 angstroms thick. A contact opening 126 is made using conventional photolithography and etching techniques. The second insulating layer 124 can be used optionally as a hard mask during the etching. The etching is controlled to stop when the substrate 120 is reached.

Figure 5:
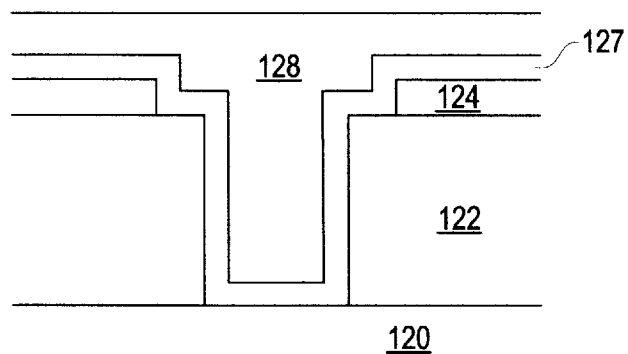

Turning to FIG. 5, a portion of the second insulating layer 124 around the contact opening 126 is removed by conventional isotropic etching methods, such as chemical dry etching, wet etching or a spacer process. Note that the etching shown have a high etching selectivity between the second insulating layer 124 and the first insulating layer 122 so that the second insulating layer 124 is etched more readily. Preferably 100–800 angstroms of the second insulating layer 124 is removed in the lateral direction. A barrier metal layer 127 is deposited along the walls of the contact opening and atop the second insulating layer 124. The barrier metal layer 127 is preferably formed of Ti, TiN, Ta, TiW, or WN. The barrier metal layer 127 is preferably about 100–2000 angstroms thick. Next, a first conducting layer 128, is deposited into the contact opening 126 and atop the barrier metal layer 127. The first conducting layer 128 is preferably formed of tungsten, copper or aluminum.

Figure 6:
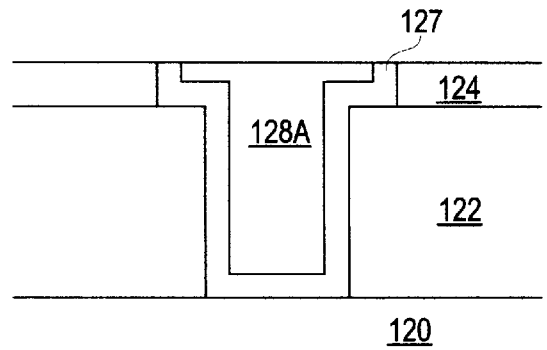

Turning to FIG. 6, the portion of the first conducting layer 128 and the barrier metal layer 127 atop the second insulating layer 124 is removed by CMP or any other conventional method. The remaining first conducting layer is known as a plug 128a. As shown in FIG. 6, the contact area of the plug 128a is increased through the use of the etched-back or recessed second insulating layer 124.

Figure 7:
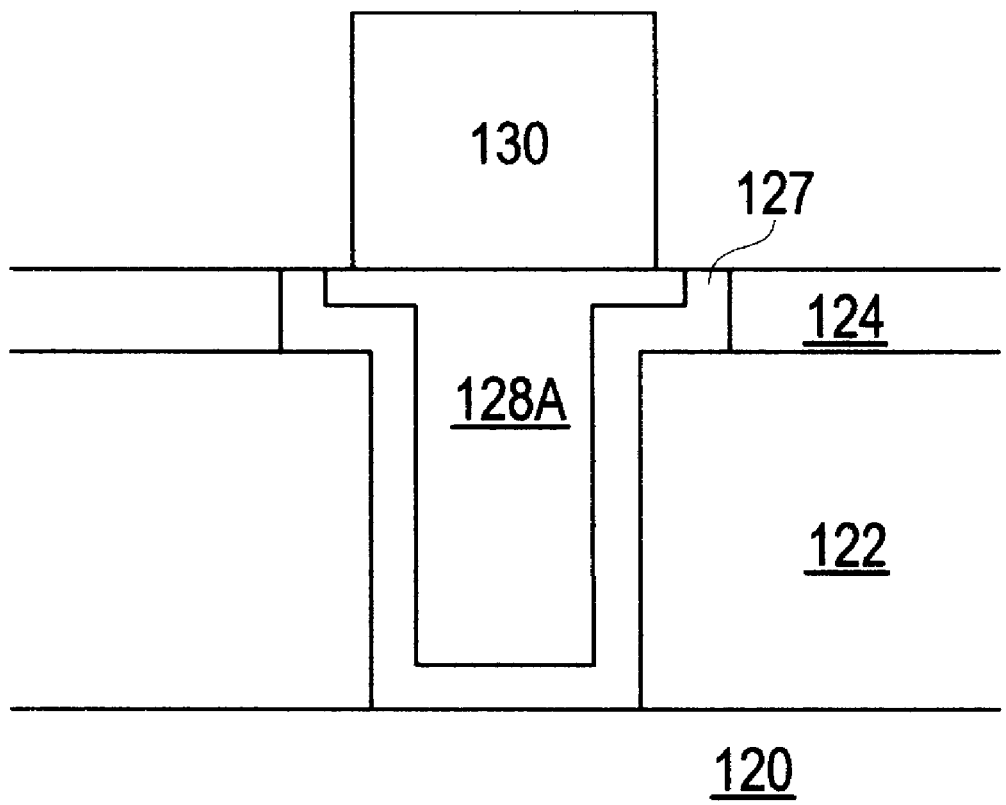

Turning to FIG. 7, a second conducting layer is deposited atop the second insulating layer 124, the barrier metal layer 127 and the plug 128a. A portion of the second conducting layer is removed using conventional photolithography and etching techniques, leaving a conductive structure 130 atop the plug 128a.

The increased contact area of the plug 128a ensures that the conductive structure 130 and the plug 128a are in full contact. In addition, the increased width in the top portion of the plug 128a alleviates the keyhole problem. Also, the second insulating layer 124 is useful for preventing or reducing fluorine diffusion if fluorine-based materials are used in the first insulating layer 122. Furthermore, during removal of the barrier metal layer 127 and the first conducting layer 128 (FIGS. 5 and 6), the second insulating layer 124 may be used as a stop layer.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for forming a plug on a semiconductor substrate, the method comprising:

forming an oxide layer atop said semiconductor substrate;

forming a nitride layer atop said first insulating layer;

patterning and etching said first insulating layer and said second insulating layer, stopping at said semiconductor substrate, to form a contact opening;

removing a portion of said second insulating layer that immediately surrounds the periphery of said contact opening using an isotropic etch;

forming a barrier metal layer along the walls of said contact opening and atop said second insulating layer;

forming a first conducting layer into said contact opening and atop said barrier metal layer; and removing a portion of said first conducting layer and said barrier metal layer atop said second insulating layer, leaving a plug formed of the remaining portion of said first conducting layer.

2. The method of claim 1, wherein said oxide layer is formed of silicon oxide, BPSG, TEOS oxide, or any combination thereof.

3. The method of claim 1, wherein said nitride layer is formed of SiN or SiON.

4. The method of claim 1, wherein said nitride layer is about 100–2000 angstroms thick.

5. The method of claim 1, wherein said removed portion of said nitride layer is about 100–800 angstroms in width, further wherein said removed portion is removed uniformly around said contact opening.

6. The method of claim 1, wherein said barrier metal layer is formed of Ti, TiN, Ta, TiW or WN.

7. The method of claim 1, wherein said barrier metal layer is about 100–2000 angstroms thick.

8. The method of claim 1, wherein said first conducting layer is formed of W, Cu, or Al.

9. The method of claim 1, further including:

forming a second conducting layer atop said nitride layer, said barrier metal layer, and said plug; and removing a portion of said second conducting layer to leave a conductive structure, formed of the remaining portion of said second conducting layer, atop said plug.

10. A method for forming a plug on a semiconductor substrate, the method comprising:

forming an oxide layer atop said semiconductor substrate;

forming a nitride layer atop said first insulating layer;

patterning and etching said first insulating layer and said second insulating layer, stopping at said semiconductor substrate, to form a contact opening;

removing a portion of said second insulating layer surrounding said contact opening using an isotropic etch, said removal being done substantially uniformly around the periphery of said contact opening;

forming a barrier metal layer along the walls of said contact opening and atop said second insulating layer;

forming a first conducting layer into said contact opening and atop said barrier metal layer; and removing a portion of said first conducting layer and said barrier metal layer atop said second insulating layer, leaving a plug formed of the remaining portion of said first conducting layer.

* * * * *